United States Patent

[11] 3,602,781

[72] Inventor Paul Anton Herman Hart
Emmasingel, Eindhoven, Netherlands

[21] Appl. No. 861,252
[22] Filed Sept. 26, 1969
[45] Patented Aug. 31, 1971
[73] Assignee U.S. Philips Corporation
New York, N.Y.
[32] Priority Sept. 27, 1968
[33] Netherlands
[31] 6813833

[54] INTEGRATED SEMICONDUCTOR CIRCUIT COMPRISING ONLY LOW TEMPERATURE PROCESSED ELEMENTS
5 Claims, 5 Drawing Figs.

[52] U.S. Cl. .......... 317/235 R, 148/1.5, 317/235 D, 317/235 E, 317/235 UA, 317/235 AL, 317/235 G
[51] Int. Cl. .......... H01l 19/00
[50] Field of Search .......... 317/235

[56] References Cited

UNITED STATES PATENTS

| | | | |
|---|---|---|---|
| 3,035,186 | 5/1962 | Doucette | 317/235 |
| 3,255,047 | 6/1966 | Escoffery | 317/235 |
| 3,388,009 | 6/1968 | King | 317/235 |
| 3,389,264 | 6/1968 | Briggs et al. | 317/235 |
| 3,463,975 | 8/1969 | Biard | 317/235 |
| 3,472,712 | 10/1969 | Bower | 317/235 |

*Primary Examiner*—Jerry D. Craig
*Attorney*—Frank R. Trifari

ABSTRACT: An integrated semiconductor is described in which all the interconnected circuit elements, including barrier layers and contacts, comprise only metal-semiconductor junctions, ion implanted junctions, or insulating layers, produced by low temperature processes only, to avoid detrimental effects on a supporting substrate.

Figure 1:
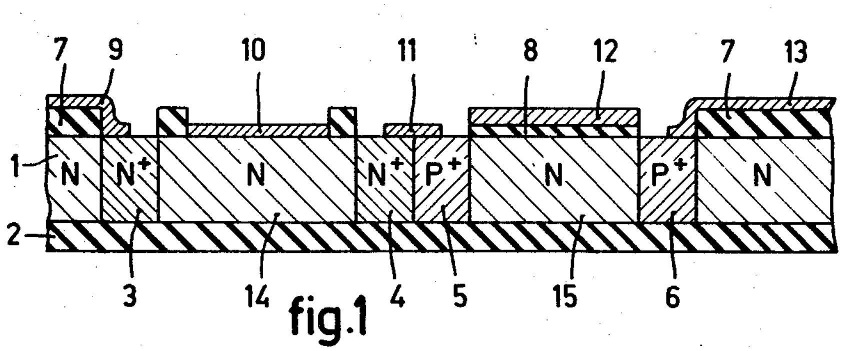

INVENTOR.
PAUL A. H. HART
BY
[signature]
AGENT

INVENTOR.

PAUL A. H. HART

BY

AGENT

INTEGRATED SEMICONDUCTOR CIRCUIT COMPRISING ONLY LOW TEMPERATURE PROCESSED ELEMENTS

The invention relates to an integrated semiconductor circuit comprising at least two dissimilar semiconductor circuit elements which contain a monocrystalline semiconductor body, in which at least one barrier layer and on which at least one connection contact is provided, said circuit elements being provided on a substrate and interconnected by conductors.

Such circuit arrangements are known in various forms, for example, hybrid circuits and monolithic circuits. In hybrid circuits a number of mutually separated semiconductor circuit elements are provided on an insulating substrate and are connected together by metal tracks. In monolithic circuits all the circuit elements are accommodated in the same semiconductor body which itself may be provided on a substrate. Intermediate constructions between these types of integrated circuits also occur.

In manufacturing all the so far known integrated circuits, processes are used at comparatively high temperatures, for example, diffusion, thermal oxidation, and so on. These processes are performed prior to the provision of the circuit element on the substrate or both prior to and after it. Therefore, not only the semiconductor material, but also the substrate and the adhering layer between the substrate and the semiconductor, will have to be capable of withstanding the said thermal treatments.

Such treatments at comparatively high temperatures have various drawbacks. In so far as the treatment takes place after providing the circuit on the substrate, the materials of the substrate and the adhering layer should be chosen to be so that no undesireable effects, for example, out-diffusion from the substrate, can occur. It has furthermore been found that particularly semiconductor materials having comparatively high resistivities can adversely be influenced by treatments at high temperatures.

For example, in such materials the resistivity can sometimes vary strongly due to a treatment at high temperature, and even the conductivity type of the material can be inverted while the lifetime of the minority charge carriers in the material can also be drastically reduced.

It is the object of the invention to provide an integrated semiconductor circuit of a novel type, in which the drawbacks as described and associated with known integrated circuits are avoided.

The invention is based on the recognition of the fact that by using only those circuit elements in the manufacture of which no treatments at high temperatures are used, important technological advantages and advantages from a point of view of circuit technology are obtained in an integrated circuit.

According to the invention, an integrated semiconductor circuit of the type mentioned in the preamble is therefore characterized in that the barrier layers and connection contacts present are all constituted by a metal semiconductor junction, a junction between a region formed by ion implantation and the semiconductor body, or an insulating layer. Ion implantation as usual is understood to mean the incorporation of ions in a crystal lattice by bombardment with ionized atoms accelerated by an electric field.

In an integrated circuit according to the invention high-ohmic semiconductor materials may be used without objections in connection with the above. This is of advantage particularly when the circuit comprises MOS transistors, the transconductance of which increases when the resistivity of the channel region increases, or photodiodes, phototransistors and the like, in which the use of a high-ohmic semiconductor material enables the formation of depletion regions of comparatively large volume, with as a result a great sensitivity of the photosensitive circuit elements.

When using a substrate, such as aluminum oxide, no undesirable diffusion from the substrate, in this case aluminum, can occur in the semiconductor material, As a result of this, in the circuit arrangement according to the invention, the choice of the carrier materials is much greater than in the known integrated circuits. According to an important preferred embodiment, all the semiconductor circuit elements are provided in the same semiconductor body. In this manner a monolithic integrated circuit is obtained which can be provided on an insulating substrate, if desirable. The circuit arrangement may in circumstances also be provided advantageously on a very readily heat-conducting substrate, for example, copper or beryllium oxide, as a result of which the heat dissipation is considerable improved.

According to a further important preferred embodiment the integrated circuit is provided on a substrate having a dielectric constant which is smaller than, and preferably more than 3 times smaller than, that of the semiconductor material, for example, Teflon, which is poorly resistant to high temperatures. As a result of this and also as a result of the narrower tolerances in doping and the better control of the stray capacitances which can be realized in the circuit according to the invention, more rapid circuits can be obtained.

According to a preferred embodiment of a monolithic integrated circuit according to the invention the semiconductor body consists of a thin semiconductor layer having a thickness of at most 10 $\mu$m.

The separate semiconductor elements or groups thereof may advantageously be insulated electrically from each other, by providing a network of strips having a conductivity type which is opposite to that of the semiconductor layer by ion implantation throughout the thickness of the semiconductor body. The PN junction between said network and the remaining part of the semiconductor layer in the operating condition should be biased in the reverse direction. The mutual insulation of the circuit elements may also be effected by providing oppositely located networks of metal strips on either side of the semiconductor layer which strips form Schottky junctions with the layer which in the operating conditions are biased so strongly in the reverse direction that the depletion layers of metal-semiconductor junctions situated opposite to each other, touch each other.

Alternatively, it is possible, starting from an adhering semiconductor layer provided on a substrate, and in which layer the circuit elements are provided, to separate them from each other by etching grooves in the semiconductor layer throughout the thickness of the layer up to the substrate, as a result of which the layer is divided into islands.

Figure 2:
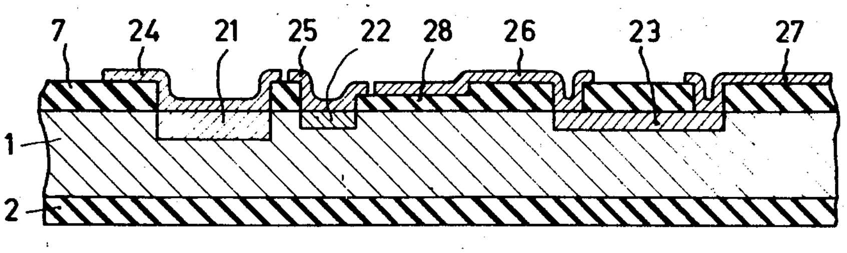
Figure 3:
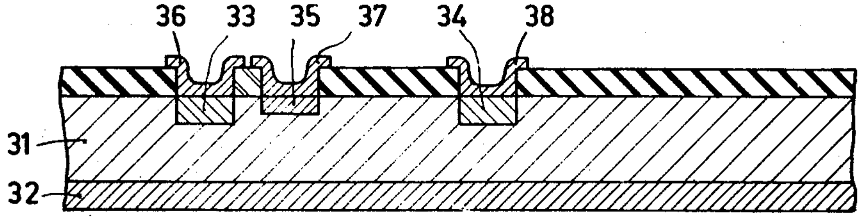
Figure 4:
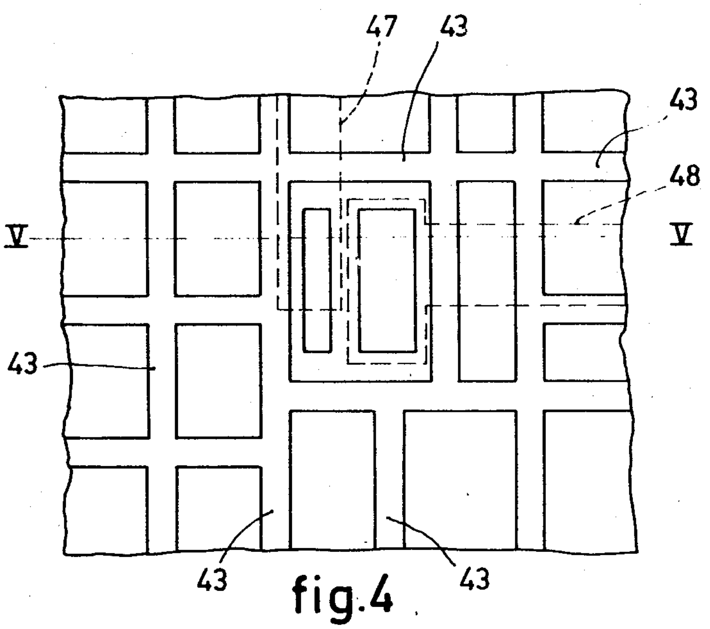
Figure 5:
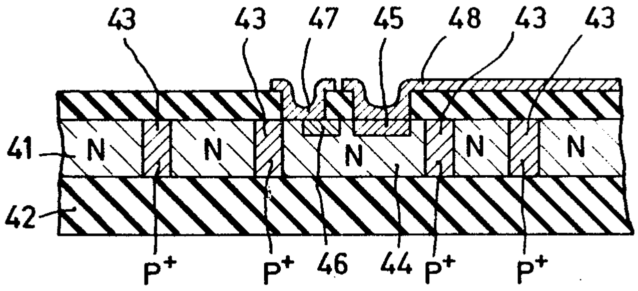

In order that the invention may be readily carried into effect, a few examples thereof will now be described in greater detail, by way of example, with reference to the accompanying drawings, in which, FIG. 1 is a diagrammatic cross-sectional view of a part of an integrated circuit according to the invention, FIG. 2 is a diagrammatic cross-sectional view of a part of another integrated circuit according to the invention, FIG. 3 is a diagrammatic cross-sectional view of a part of a further integrated circuit according to the invention, FIG. 4 is a diagrammatic plan view of a part of still another integrated circuit according to the invention and FIG. 5 is a diagrammatic cross-sectional view taken on the line V—V of the circuit arrangement shown in FIG. 4.

FIG. 1 is a diagrammatic cross-sectional view of a part of an integrated semiconductor circuit according to the invention comprising a thin monocrystalline *n*-type silicon layer having a resistivity of 0.1 ohm cm. and a thickness of 2$\mu$m, which is cemented to an insulating substrate of Teflon. Teflon has a dielectric constant which is more than 3 times lower than that of silicone.

The high-doped $n+$ regions 3 and 4 are provided in the layer 1 by ion implantation of phosphorus ions throughout the thickness of the layer, and the highly conducting $p+$ 5 and 6 are provided by implantation of boron ions.

The silicon layer is at least partly covered with a layer 7 of silicon oxide, thickness 1 $\mu$m, which is provided pyrolitically by decomposing ethoxy silane in the conventional manner. A part 8 of this oxide layer is reduced to a thickness of 0.1 μm, for example, by etching.

Metal layers 9 to 13 are provided on the oxide layer, the layers 9, 10, 11 and 13 of which contact the underlying semiconductor regions in windows in the oxide layers. The layers 9, 11, 12 and 13 consist of aluminum, and the layer 10 consists of gold. The layer 9 forms a low-ohmic contact with the region 3, the layer 11 forms a low-ohmic contact with the regions 4 and 5 and the layer 13 forms a low-ohmic contact with the region 6. For this purpose, the regions 3, 4, 5 and 6 should naturally be sufficiently highly doped.

The gold layer 10 forms a Schottky junction with the region 14, as a result of which the region 3, 14 and 4 form a field effect transistor with source and drain contacts 9 and 11 and a Schottky gate electrode 10 which, if biased in the reverse direction, forms a depletion region in the channel region 14. The regions 5, 15 and 6 form a MOS transistor with the metal layers 11 and 13 as source and drain contacts, and with the aluminum layer 12 as a gate electrode.

The circuit arrangement shown in FIG. 1 can be manufactured by means of methods commonly used in semiconductor technology, in which the thin silicon layer 1 can be obtained, for example by providing first an epitaxial layer on a substrate and then removing the substrate by an electrolytic etching process. The whole device can be manufactured exclusively by means of operations in which the silicon is not heated above a temperature of 400° C.

Figure 2 is a diagrammatic cross-sectional view of a part of another circuit arrangement according to the invention. The silicon layer 1, the substrate 2 and the oxide layer 7, are the same as those of FIG. 1. The regions 21, 22, 23 are obtained by ion implantation. The region 21 has *p*-type conductivity and forms a PN junction with the layer 1. The region 22 has *n*-type conductivity and is higher doped than the layer 1. The region 23 is comparatively high-ohmic *p*-type conductive.

The metal layers 24 to 27 all consist of aluminum. The thickness of the part 28 of the oxide layer has been reduced to 0.05 μm. The metal layer 26 forms a capacity with the oxide layer part 27 and the layer 1, and is also connected to the region 23 which forms a resistance between the contact layers 26 and 27.

FIG. 3 is a diagrammatic cross-sectional view of a part of another integrated circuit according to the invention. In this embodiment the silicon layer 31, thickness 1μm, is of *p*-type silicon, having a resistivity of 0.05 ohm cm. The layer is provided on a copper substrate 32 which forms a Schottky junction with the silicon layer 31. The regions 33 and 34 are high-doped *n*-type regions obtained by implantations of phosphorous ions, the region 33 of which forms the emitter of a transistor with the layer 31 as the base and copper layer 32 as the collector. The base contact is formed by a high-doped *p*-type region 35 obtained by implantation of boron ions. This contact also serves as a connection with the PN-diode which is formed by the region 34 and the layer 31. The contact layers 36 to 38 again consist of aluminum.

FIG. 4 is a plan view and FIG. 5 is a diagrammatic cross-sectional view taken on the line V—V of FIG. 4 of a part of an integrated circuit according to the invention in which a possibility is shown for the mutual electrical insulation of the circuit elements. An *n*-type silicon layer 41 (see FIG. 5) having a resistivity of 0.1 ohm cm. and a thickness of 2μm. is provided on a substrate 42 of aluminum oxide. P-type channels 43 are provided on the layer 41, throughout the thickness of the layer by implantation of boron ions (see FIG. 4), which channels divide the layer 41 into islands and form a network, as a result of which the semiconductor circuit elements situated within the various meshes of said networks are electronically separated from each other, if the PN junction between the network 43 and the layer 41 is biased in the reverse direction. For that purpose, the network 43 is preferably set up at the lowest potential of the circuit. As an example it is shown how in the island 44 a diode is provided comprising a *p*-type region 45, provided by implantation of boron ions, an *n*-type region 46 provided by implantation of phosphorous ions and the contacting aluminum strips 47 and 48. This diode is electrically separated from the surrounding islands by the network 43, which islands may each comprise one or more further circuit elements.

It will be obvious that the invention is not restricted to the examples described, in which it has been endeavored only to describe a few embodiments of a circuit arrangement with components which can be manufactured entirely at low temperatures. Without departing from the scope of this invention, a large number of different integrated circuits can be composed by those skilled in the art by means of said components which all show the advantages described.

I claim:

1. An integrated semiconductor circuit comprising a substrate, a plurality of semiconductor circuit elements on said substrate, and interconnections for said circuit elements to provide the said circuit, at least two of said circuit elements comprising a monocrystalline semiconductor body and being capable of performing different circuit functions and including at least one barrier layer to which at least one connection contact is made, all of the barrier layers present in all of the circuit elements being selected from the group consisting of a metal-semiconductor junction, an ion-implanted region junction, and an insulating layer, the said barrier layer of one of said two circuit elements being one of said group and the said barrier layer of the other of said two circuit elements being a different one of said group, all of said circuit elements having been produced by a low temperature process not exceeding 400° C.

2. An integrated semiconductor circuit as set forth in claim 1 wherein the circuit is monolithic with all the circuit elements incorporated in a common semiconductor body serving as a substrate.

3. An integrated semiconductor circuit as set forth in claim 1 wherein the substrate is a plastic sheet incapable of withstanding temperatures exceeding 400° C.

4. An integrated semiconductor circuit as set forth in claim 1 wherein at least several of the circuit elements are electrically isolated from one another by ion-implanted striplike regions within the semiconductor body and of a conductivity type opposite to that of the body.

5. An integrated semiconductor circuit as set forth in claim 1 wherein at least several of the circuit elements are electrically isolated from one another in the body by a Schottky barrier formed by a metal strip provided on the body and reverse biased to form a depletion layer through the body.

PO-1050 (5/69)

UNITED STATES PATENT OFFICE
CERTIFICATE OF CORRECTION

Patent No. 3602781 Dated August 31, 1971

Inventor(s) PAUL ANTON HERMAN HART

It is certified that error appears in the above-identified patent and that said Letters Patent are hereby corrected as shown below:

Column 1, line 75 - "material," should read -- material. --.

Column 2, line 11 - "considerable" should read -- considerably --.

line 37 - "conditions" should read -- condition --.

line 66 - "substrate of Teflon" should read -- substrate 2 of Teflon -- .

line 71 - "p+ 5" should read -- p+ regions 5 --.

Signed and sealed this 7th day of March 1972.

(SEAL)
Attest:

EDWARD M.FLETCHER,JR.
Attesting Officer

ROBERT GOTTSCHALK
Commissioner of Patents